(12) United States Patent
Gallo

(10) Patent No.: US 6,188,342 B1
(45) Date of Patent: Feb. 13, 2001

(54) PHOTONIC A/D CONVERTER USING PARALLEL SYNCHRONOUS QUANTIZATION OF OPTICAL SIGNALS

(75) Inventor: John T. Gallo, Lansdale, PA (US)

(73) Assignee: Tracor Aerospace Electronic Systems, Inc., Lansdale, PA (US)

(*) Notice: Under 35 U.S.C. 154(b), the term of this patent shall be extended for 0 days.

(21) Appl. No.: 09/184,666

(22) Filed: Nov. 2, 1998

(51) Int. Cl.[7] .............................. H03M 1/00; H03M 1/12
(52) U.S. Cl. ............................................ 341/137; 341/155
(58) Field of Search .................................. 341/137, 120, 341/118, 155, 156; 250/225

(56) References Cited

U.S. PATENT DOCUMENTS

| | | | |
|---|---|---|---|
| 4,502,037 | 2/1985 | Le Parquier et al. | |
| 4,712,089 | 12/1987 | Verber. | |
| 4,851,840 | 7/1989 | McAulay | 341/137 |
| 4,857,931 | 8/1989 | Gulczynski | 341/156 |
| 4,947,170 | * 8/1990 | Falk | 341/137 |
| 5,010,346 | 4/1991 | Hamilton et al. | 341/137 |
| 5,264,849 | 11/1993 | Kondoh et al. | 341/137 |
| 5,381,147 | * 1/1995 | Birkmayer | 341/137 |
| 5,684,486 | 11/1997 | Ono et al. | 341/159 |
| 5,850,195 | * 12/1998 | Berlien, Jr. et al. | 341/137 |

* cited by examiner

Primary Examiner—Patrick Wamsley
(74) Attorney, Agent, or Firm—Seidel, Gonda, Lavorgna & Monaco

(57) ABSTRACT

An N-bit analog to digital converter for converting optical signals into digital form is disclosed. The converter comprises N optical signal channels, one channel for each significant bit of the N-bit digital representation of the optical signal. Each optical channel comprises optical waveguides and photodetectors for converting the optical signal into electronic signals. The sensitivity of the photodetectors in each channel varies from most significant to least significant bit in the digital conversion. The electronic signals drive high-speed switching devices, each of which is set to a different threshold depending on which bit of the digital conversion the switch delivers. There are N switching devices directly driven by the N photodetector channels yielding N digital bits representing the magnitude of the optical input signal.

27 Claims, 4 Drawing Sheets

PHOTONIC A/D CONVERTER USING PARALLEL SYNCHRONOUS QUANTIZATION OF OPTICAL SIGNALS

FIELD OF THE INVENTION

The present invention pertains to the field of optical signal processing; specifically, the invention relates to the sampling and conversion of analog optical signals into digital form for computer processing of lightwave information.

BACKGROUND OF THE INVENTION

Digital computers far exceed the capabilities and speeds of analog machines for complex mathematical processing. However, a large amount of information that may be processed by digital machines exists in analog form. The analog signals must be converted to digital form before they can be subjected to digital analysis, manipulation and storage.

Electronic conversion of analog signals to digital format is an established technology. But as digital processing capacity and speed has increased with the evolution of better storage and computation hardware, there has been increasing demand for faster analog to digital (A/D) converters to provide higher sampling rates and allow conversion of ever higher frequency analog signals to digital form. Electronic A/D conversion has a frequency limit at this writing of about 6 GHz due to thermal dissipation and fundamental speed limitations of electronic circuits that respond to signal input and create digital output.

High speed electronic A/D conversion requires complex circuits. Typical N-bit flash A/D converters require $2^N-1$ comparator circuits whose outputs must be encoded to produce an N-bit parallel output. Thus, an eight-bit flash converter requires 255 comparators and an eight-bit encoder device to produce an eight-bit parallel output. The electronic encoding of the comparator output is also a major factor in the fundamental speed limitation of electronic converters.

The development of optical analog and data transmission techniques has enabled the expansion of signal bandwidths and operation into higher and higher frequencies for many kinds of systems. These systems must be interfaced with digital computers to take full advantage of the signal processing capabilities of the digital systems. Therefore, it becomes necessary to develop even faster A/D converters to sample the extremely high frequency signals carried on and by lightwaves. Because speed is related to circuit complexity, the simpler the circuit is the faster it may perform. The present invention is directed to providing an A/D converter for lightwave signals, capable of operation into frequencies far above 6 GHz, that is less complex than an electronic A/D converter on a per bit of output basis.

SUMMARY OF THE INVENTION

The present invention is a flash photonic A/D converter comprising an array of photodetectors and high-speed transistors. In the presently preferred embodiment, the photodetector array comprises velocity-matched distributed photodetectors (VMDP). Velocity-matched, distributed photodetectors are optical waveguides on which have been fabricated a number of photodetectors that are interconnected by an electrical coplanar waveguide. An array of these devices is used to detect the amplitude of an optical signal. The output of the array is coupled to a network of high-speed transistors configured as an array of binary switching circuits. One such switching circuit is provided for each waveguide in the photodetector array.

The optical signal is divided among a plurality of parallel velocity-matched distributed photodetector channels. In the presently preferred embodiment, each photodetector channel has a different sensitivity to the incident optical signal. This difference in sensitivity is achieved by varying the number of photodetectors integrated along the optical channel waveguide. The channel with the least sensitivity (that is, the fewest number of photodetectors) determines the most significant bit in the quantization of the lightwave signal. This allows a division of the input analog optical signal whereby a small fraction of the signal is used to determine the most significant bit and greater portions of the input signal are directed to each lesser significant bit. The least significant bit, which requires the greatest quantization accuracy, receives the greatest portion of the input signal which improves the resolution of the A/D conversion.

The detector current from each waveguide channel is fed to the high-speed binary switching circuit. There is one switching circuit for each channel. The threshold for switching the switching circuit is set to produce a digital "high" output at a certain optical detector current input level. When the detector current is below the threshold, the switching circuit remains in a digital "low" state; when the threshold is exceeded, the switching circuit switches to a "high" condition.

Every switching circuit output (except for the least significant bit) is tied to the input threshold circuit of each subsequent bit of lower significance. When a channel output switching circuit switches to a high condition, an electrical load in the switching network is switched into the threshold circuits of each of the lower-order bits, effectively subtracting the input level of the higher bit from each of the lower order bits.

An analog to digital converter for optical signals that transforms analog lightwave amplitude into digital form can be an important building block in communications, medical, defense and industrial systems. The photonic A/D converter of the present invention enables sampling of lightwave signals at sampling rates well beyond the current 6 GHz fundamental rate limit of electronic A/D components.

DESCRIPTION OF THE DRAWINGS

For the purpose of illustrating the invention, wherein like reference numerals indicate like elements, there is shown in the drawings a form which is presently preferred; it being understood, however, that this invention is not limited to the precise arrangements and instrumentalities shown.

DESCRIPTION OF THE INVENTION

The invention is an N-bit photonic analog to digital converter. The photonic analog to digital (A/D) converter accepts a lightwave input and quantizes its magnitude by converting the lightwave amplitude into an electronic output that drives an array of N high speed switching comparators. The N-bit comparator array yields a digital representation of the input optical signal amplitude.

Figure 1:
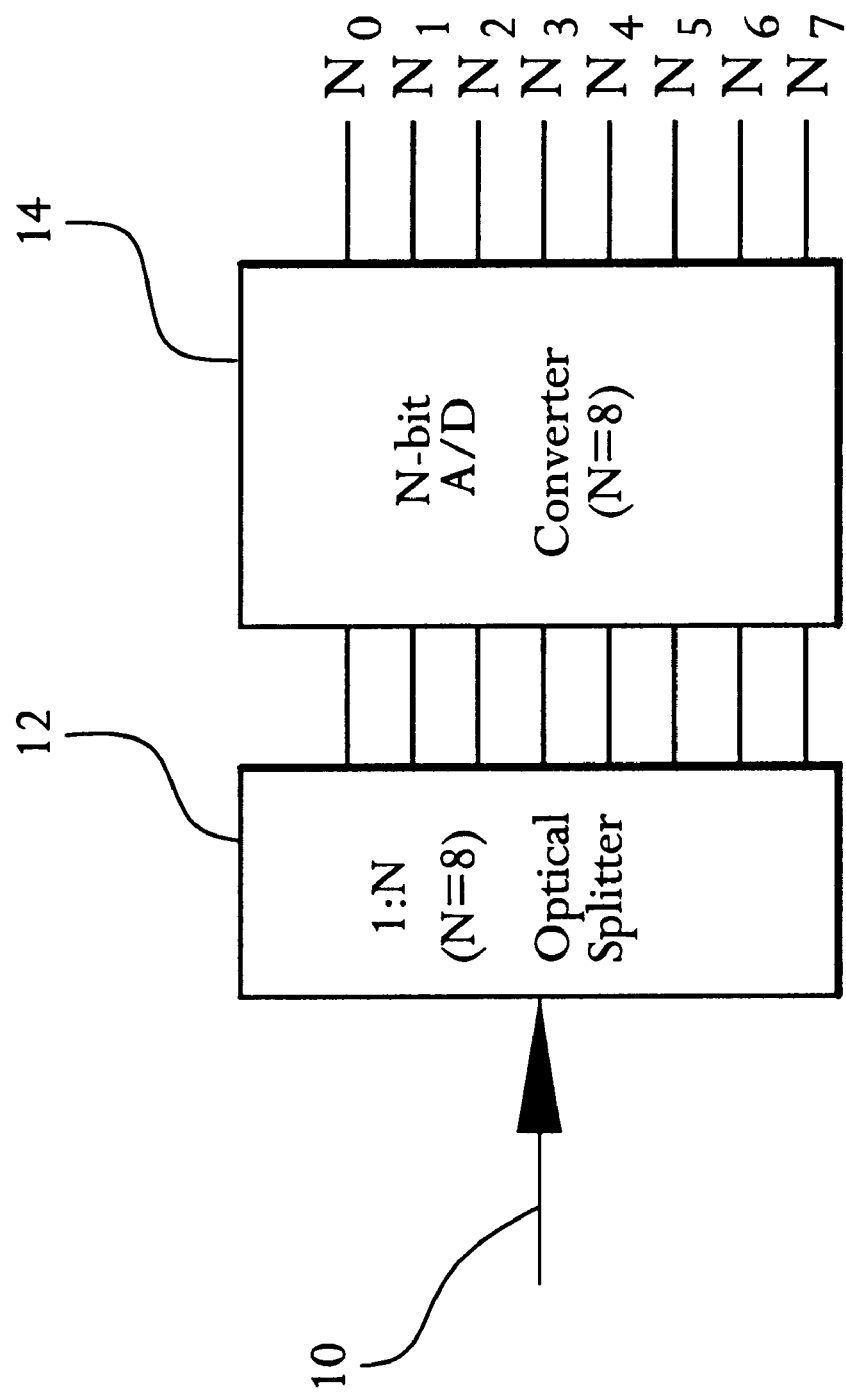
FIG. 1 is a block diagram of the invention.

Referring to FIG. 1, an optical signal 10 input is divided into N optical signals in an optical signal splitter 12. In the illustration in FIG. 1, and for the remainder of this description, N is eight (8) unless otherwise noted. N corresponds to the number of digital bits in which the analog optical signal is to be represented after conversion (e.g., four, eight, twelve, sixteen). However, N may be any convenient number that serves a desired function and that is within the practical capabilities of the components available. The basic architecture of the invention described herein is adaptable to any number of bits of resolution from two up, including odd numbers of bits.

The photonic A/D converter 14 of the invention accepts N optical signal inputs and produces N digital bits (shown as $N_0$ to $N_7$ in FIG. 1) representing the amplitude of the optical input signal at a given instant. In the converter 14 are N channels in which an optical signal input is converted to an electronic signal for each channel. The electronic signal drives a high speed digital switch device that has a binary output. This device serves to sample and hold the digital output for subsequent electronic processing. The binary output of each channel is one significant bit of the N-bit digital representation of the amplitude of the optical input signal.

Figure 2:
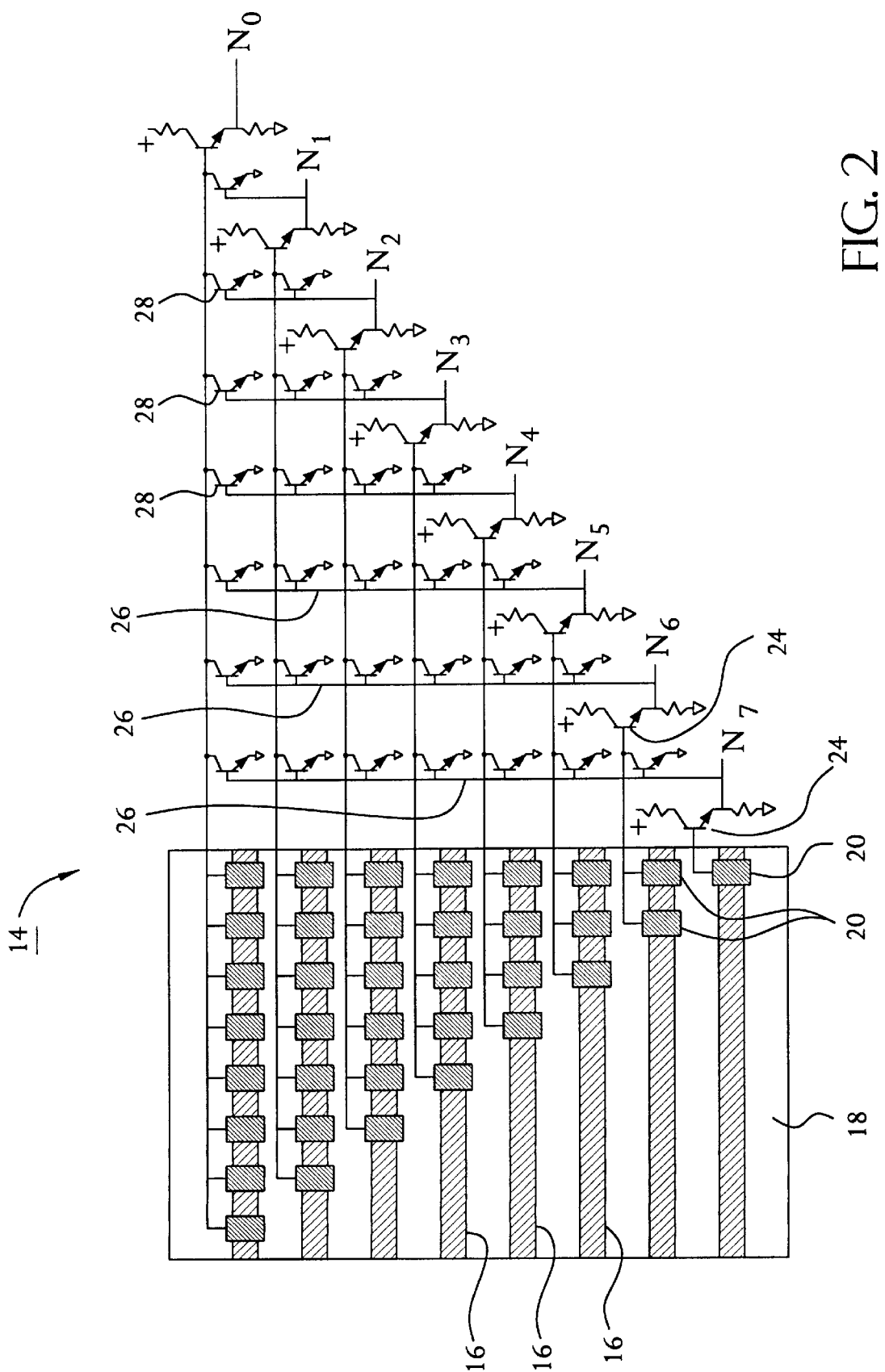
FIG. 2 is a simplified functional diagram of the circuits that comprise the analog to digital converter of the invention.

Referring to FIG. 2, the A/D converter 14 comprises N (eight in the Figure) photodetector channels 16 disposed on a suitable substrate 18 employed for optical circuits. Each photodetector channel 16 has one or more photodetector 20 devices for converting light energy into ;an electronic output (i.e., voltage and/or current). The combination of one photodetector channel 16 and its associated photodetectors 20 will be referred to herein as an optoelectronic channel; thus there are N channels in the A/D converter 14.

The sensitivity of the photodetectors 20 in each channel depends on the significance of the digital bit produced by the channel. The most significant bit (MSB) requires the least sensitivity; the least significant bit (LSB) requires the greatest sensitivity. This promotes the required channel sensitivity for signal level quantization commensurate with the bit significance that channel represents. In the illustrated converter 14 of FIG. 2, as an example, the MSB channel ($N_7$) has a single photodetector 20. Each lower order significant bit channel adds greater sensitivity. There are eight photodetectors 20 in the LSB channel ($N_0$) for an N=8 channel device of FIG. 2. The progressive increase in the number of photodetectors from MSB to LSB adjusts the sensitivity of each channel to the optical input.

The specific number of photodetector devices per channel, shown by example in FIG. 2 as one ($N_7$) to eight ($N_0$), is not necessarily fixed. What is significant from a design standpoint is the concept that the fewest photodetectors are in the MSB channel and the number increases as the bit significance of the channel decreases. Thus, the MSB channel might be fabricated with 2 photodetectors and the number might increase in increments of two per channel, reaching sixteen for the LSB channel. Other numerical device counts are feasible for achieving the desired result.

In the presently preferred embodiment, the input optical signal 10 is divided into N signals for the N channels of the converter such that each channel is provided progressively more optical power from most to least significant bit on a predetermined scale. Using the optical power magnitude routed to the MSB channel as the reference, each lower order channel's share of the input optical power increases exponentially by powers of two (2). For example, assume that the MSB channel $N_{N-1}$ receives input optical magnitude M. The input power splitter 12 provides $M(2^1)$, or double, the optical power to the next lower order bit channel $N_{N-2}$. The next lower order bit channel $N_{N-3}$ would receive $M(2^2)$, or four times, the optical power that the MSB channel receives. The progression of exponential increase continues through the least significant bit channel. Each channel is provided more power to increase the sensitivity of the channels from most to least significant bit. Because the LSB represents the finest resolution bit of the converter, it receives the greatest share of the input power.

In the presently preferred embodiment of the invention, each optoelectronic channel comprises high speed velocity-matched distributed photodetectors (VMDP). VMDPs are optical waveguides on which have been fabricated a number of photodetectors that are interconnected with optical and coplanar electrical waveguides. The quantum efficiency of these devices is based upon the number of photodetectors distributed along the optical waveguide.

The term "velocity-matched" refers to matching the velocity of the RF optics along the optical waveguide. The photodetectors along the waveguide each produce an electrical response to the optical signal. These responses must combine constructively to produce the correct electrical output, thus the RF optics along the waveguide must ensure that the photodetectors all operate in phase with one another in any single channel to produce the correct result.

Arrays of VMDP devices, with varying numbers of photodetectors, may be used to detect a single high speed optical signal distributed evenly among the devices. Proper selection of the number of channels and the number of photodetectors in each channel allows N simultaneous measurements to be made of the optical signal amplitude. Each VMDP channel can be fabricated to have a predetermined sensitivity to optical signal input.

In each channel, the photodetectors 20 produce an electronic signal in proportion to the amplitude of the lightwave signal input to the channel. This electronic signal is employed to drive an array of high speed switching devices 24 that produce a binary output. Collectively, the binary output of the array of switching devices 24 becomes the N-bit digital electronic representation of the optical signal amplitude.

In the presently preferred embodiment of the invention, the switching devices 24 are differential pair comparators. The comparator comprise high speed transistors which are capable of the switching speed that is necessary for operation at high frequencies (6 GHz and above). It should be noted that the illustration in FIG. 2 represents the switching devices 24 as single transistors for simplicity only. FIG. 2 is not intended to be a detailed wiring diagram for the circuit; it is a simplified schematic illustration of the circuit. It is considered to be well within the capabilities of one skilled in electronic arts to implement a differential pair or other comparator circuit.

The detected current: in each optoelectronic channel feeds the input of the associated switching device 24. The output of the switching device 24 is binary and represents one significant bit of the quantization of the optical signal.

Each channel is designed to detect light and switch its associated bit to a digital "high" at a given predetermined threshold. Higher order bits influence the threshold requirements of lower order bits. Each comparator from the MSB to the LSB+1 has a feed forward circuit 26 that places an electrical load 28 (shown in FIG. 2 as a transistor for illustration only) on all lower order bits when the higher order bit switches "high." The LSB does not require the feed forward circuit.

The electric load 28 effectively changes the threshold current for the comparator switch on the lower order bits. It essentially "subtracts" the higher order bit's contribution to the overall optical amplitude measurement, leaving the lower order bits to independently measure the remaining amplitude of the optical input. Higher order bits that do not switch "high" because their switching threshold is not exceeded do not affect the measurement by the lower order bits because the loads of the higher bit(s) are not switched on. The lower order bit switching thresholds are unaffected.

The implementation of the threshold adjusting load 28 can vary according to the preference of the designer. Electrical loads can be fabricated with transistors, resistors, diodes and other discrete devices either alone or in combination. The input characteristics of the high speed switching device will determine the best configuration of the load to compensate the switching circuit in each channel according to the feed forward signals from the higher order bits. In practice, the threshold adjustment load 28 changes the switching threshold for its associated high speed switch for each higher order bit that switches "high", increasing the precision of the A/D conversion.

Figure 3A:
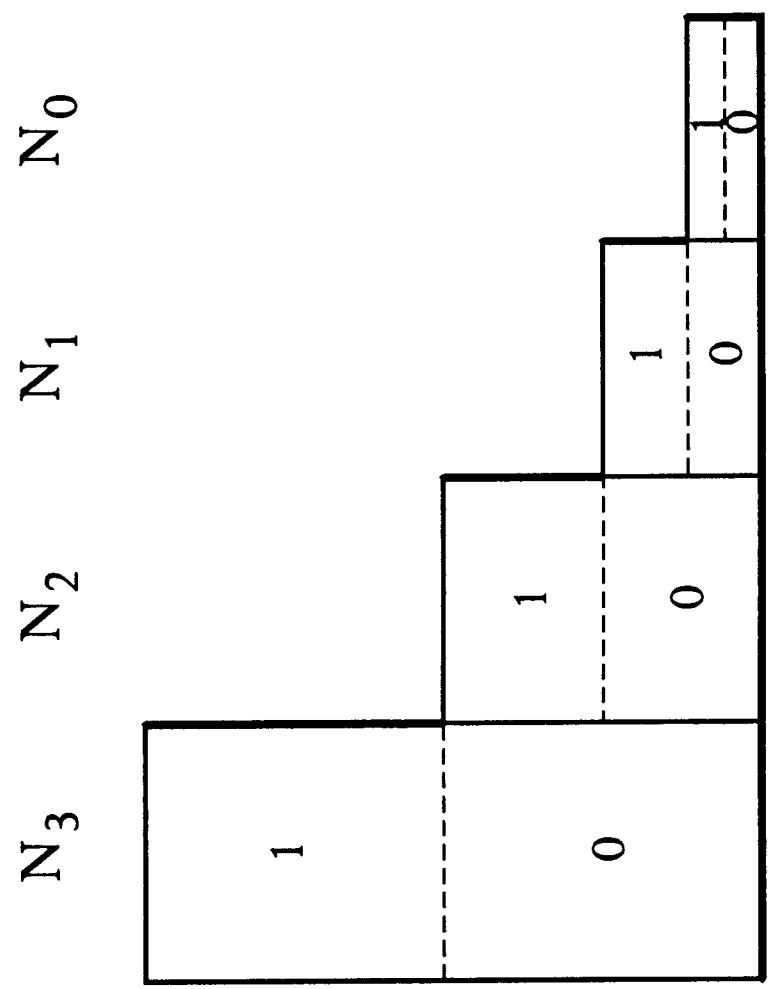
FIGS. 3a and 3b are graphical illustrations of the measurement function implemented in the invention.
Figure 3B:
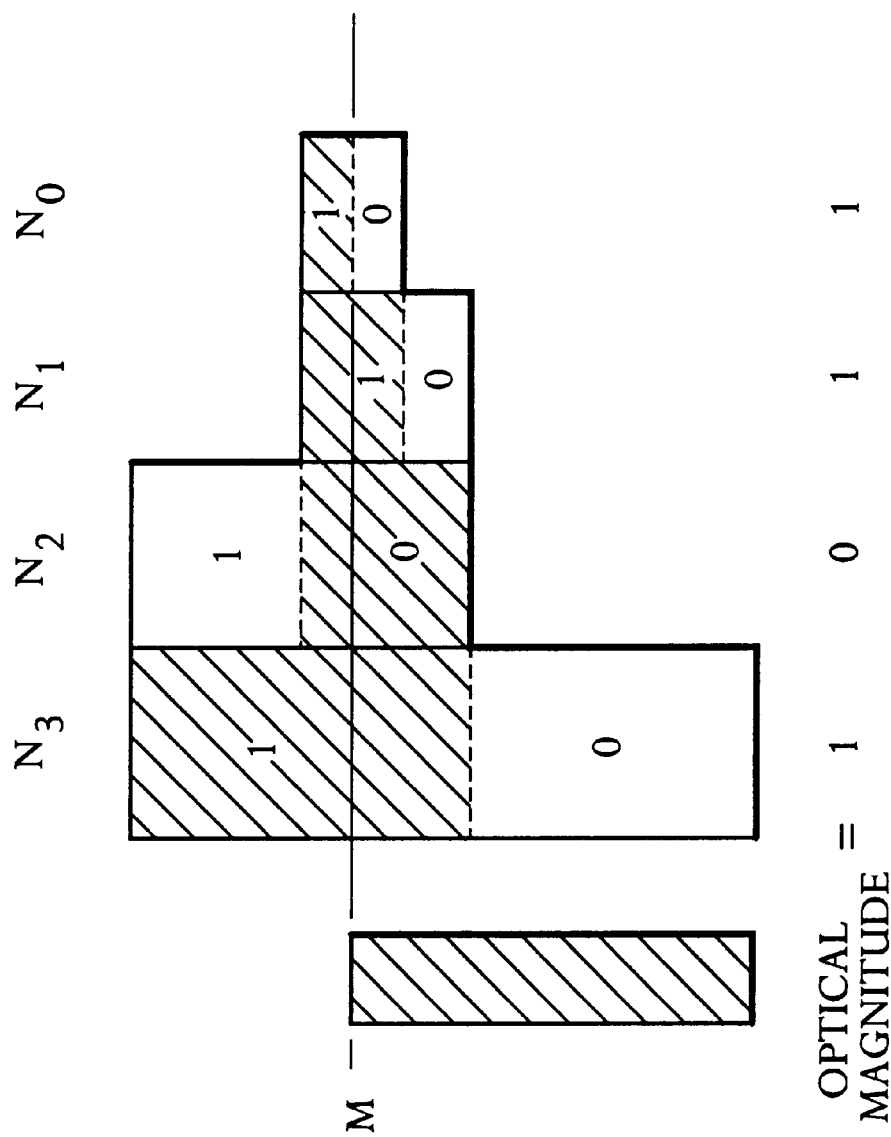

A conceptual example of the operation of the A/D converter is depicted in FIGS. 3*a* and 3*b*. The example illustrates a 4-bit optical signal A/D conversion. In FIG. 3*a*, the switching thresholds of the respective channel comparators ($N_3$ to $N_0$) are shown (by the dashed lines) to be stepped downward in increments of half of the magnitude of the next higher order bit's threshold. Thus, the switching threshold for bit $N_2$ is half that of bit $N_3$ (the MSB). If no threshold adjustment were made when a bit switched to its high ("1") state, an optical signal that had a magnitude high enough to turn on bit $N_3$ in FIG. 3*a* would also turn on the remaining bits $N_2$–$N_0$.

FIG. 3*b* illustrates the operational effect of the threshold change when a higher order bit is turned on. An optical signal with a magnitude M appears on the left side of the diagram. As it passes through the channels of the converter to the switching devices, the switching threshold for bit $N_3$ is exceeded, setting bit $N_3$ to a "1" state. The bit $N_3$ feed forward threshold circuit adjustment changes the switching thresholds of switching devices $N_2$–$N_0$ such that they measure that much of the optical magnitude M that exceeded the bit $N_3$ threshold.

As FIG. 3*b* shows, the adjusted threshold level for bit $N_2$ is not exceeded, so bit $N_2$ remains "0" and no change results for the threshold of bit $N_1$. The bit $N_1$ switching threshold is exceeded and sets bit $N_1$ to a "1" state, which adjusts the switching threshold for bit $N_0$. Nevertheless, the threshold for bit $N_0$ is also exceeded and a "1" state results on that bit. The 4-bit (4 channel) digital conversion for the optical magnitude M in FIG. 3*b* is thus "1011".

There is a one-to-one relationship between the optoeletronic channels in the A/D converter and the switching circuits that directly provide the digital output. There are N channels and N switching circuits. This relationship represents an exponential increase in the efficiency of the converter of the invention over most electronic A/D converters. Typical A/D converters require complex encoding circuitry to produce multi-bit digital outputs; an N-bit A/D converter requires $2^N-1$ comparators to produce an N-bit digital word. The present invention requires only N switching circuits for an N-bit digital word representation of an optical signal input. The N switching devices are driven by only N optoelectronic channels. This is a significant reduction in optical signal distribution, and optical and electronic hardware, necessary to quantize optical energy for digital processing.

The hardware reduction also contributes directly to the operational speed of the invention. The complex decoders in electronic A/D converters impose speed limitations by adding propagation delay and signal degradation from thermal dissipation and other factors. The comparatively simple architecture of the invention overcomes these difficulties.

The preferred embodiment of the A/D converter described herein provides progressively higher optical power to each channel of the invention by an exponential (power=2) increase per channel. Other ratios of input power division can be employed successfully. The proper operation of the converter requires that the optical power input, the number and response characteristics of the photodetectors, and the relative threshold levels of the high speed switching circuits must be coordinated to produce accurate and consistent measurements and conversions. None of these elements (optical power per channel, number of photodetectors, switching threshold per channel) can be described in fixed terms. Each may be affected by the other. A linear increasing progression of input optical power per channel could be employed while changing the number or response of the photodetectors to produce sufficient electrical response to operate the switching circuits and produce the desired and accurate digital output. Clearly, for most applications, there will finally be an overall linear response of the converter from input to output (i.e., for a 4 bit converter, 16 output states to represent 16 equal steps in the magnitude of the optical signal). But within the converter, non-linear transfer functions in the power splitter, the photodetectors, and the switching thresholds may be employed, as in the described preferred embodiment of the invention.

Because the art of fabricating optical circuits, millimeter wave integrated circuits, and discrete device integrated circuits in miniature is well advanced, the present invention may be, though it need not necessarily be, embodied in a monolithic intergrated circuit device. The materials used for photodetectors and high speed transistors may be based on indium-phosphide (InP) compounds. Indium-phosphide passive optical devices are well-established, including the technology for fabricating 1:N optical signal splitters such as that described as the input stage of the invention. The commonality of host material for both the photodetector and electrical circuit technology devices that comprise the presently preferred embodiment of the invention leads directly to monolithic integration of all of the A/D converter components on a single substrate. Single device integration greatly simplifies the manufacture and packaging of the invention and promotes better device reliability.

The present invention is capable of quantizing optical signals at sampling rates that vary with the number of bits of resolution desired in the digital word output. A 12-bit photonic A/D converter according to the present invention may operate at about 10 Gsps, while a 4-bit photonic A/D device may achieve speeds up to 100 Gsps. These speeds far exceed any attainable by the fastest electronic means believed to be presently available. As devices capable of higher switching speeds become available the operational capability of the present invention should expand accordingly.

The present invention may be embodied in other specific forms without departing from the spirit or essential attributes thereof and, accordingly, reference should be made to the appended claims, rather than to the foregoing specification, as indicating the scope of the invention.

What is claimed is:

1. An N-bit photonic analog to digital converter comprising:

a plurality of optical signal channels where the number of channels is equal to N, each of said channels comprising at least one photodetector element that produces an output proportional to the amplitude of optical signal that impinges on the photodetector, said output from respective optical channels driving one of an array of high speed transistor differential pair comparators, where one comparator is provided for each of the N optical channels, said comparators each having a binary output state, said binary comparator outputs collectively representing the N-bit output of the analog to digital conversion of the optical signal input.

2. The photonic analog to digital converter of claim 1, wherein:
each optical channel and comparator represent one significant bit from $N_0$ to $N_{N-1}$ in the N-bit analog to digital conversion of an optical signal, where $N_0$ is the least significant bit.

3. The photonic analog to digital converter of claim 2, wherein:
each optical channel comprises a means for varying optoelectronic sensitivity among the optical signal channels, said sensitivity ranging from the lowest sensitivity for the most significant bit channel $N_{N-1}$ to the highest sensitivity for the least significant bit channel $N_0$.

4. The photonic analog to digital converter of claim 2, wherein:
each comparator is set to produce a digital high bit output at a predetermined input threshold from the photodetectors in each channel.

5. The photonic analog to digital converter of claim 4, further comprising:
means for feeding the output of each higher order significant bit comparator to the inputs of the comparators for each of the lower order significant bits in the comparator array for the purpose of adjusting the input thresholds of the lower order significant bits when a higher order significant bit switches to a digital high state.

6. The photonic analog to digital converter of claim 1, wherein the photodetectors in each optical channel have different sensitivity to optical input.

7. The photonic analog to digital converter of claim 1, wherein the comparators comprise high speed heterojunction bipolar transistors.

8. The photonic analog to digital converter of claim 1, wherein the optical channels in the converter comprise optical and coplanar electronic waveguides.

9. The photonic analog to digital converter of claim 1, wherein all of the components of the analog to digital converter are integrated on a monolithic optoelectronic integrated circuit.

10. An N-bit photonic analog to digital converter comprising:
a plurality of optical signal channels where the number of channels is equal to N, each of said channels comprising at least one photodetector element that produces an output proportional to the amplitude of optical signal that impinges on the photodetector, said output from respective optical channels driving one of an array of means for binary switching, where one switching means is provided for each of the N optical channels, said switching means each having a binary output state, said binary switching means outputs collectively representing the N-bit output of the analog to digital conversion of the optical signal input.

11. The photonic analog to digital converter of claim 10, wherein:
each optical channel and switching means represents one significant bit from $N_0$ to $N_{N-1}$ in the N-bit analog to digital conversion of an optical signal, where $N_0$ is the least significant bit.

12. The photonic analog to digital converter of claim 10, wherein the switching means comprise high speed heterojunction bipolar transistors.

13. The photonic analog to digital converter of claim 12, wherein the switching means are configured as differential comparators.

14. An N-bit photonic analog to digital converter constructed in a monolithically integrated optoelectronic integrated circuit, comprising:
a plurality of optical signal channels where the number of channels is equal to N, each of said channels comprising at least one photodetector element that produces an output proportional to the amplitude of optical signal that impinges on the photodetector, said output from respective optical channels driving one of an array of high speed transistor differential pair comparators, where one comparator is provided for each of the N optical channels, said comparators each having a binary output state, said binary comparator outputs collectively representing the N-bit output of the analog to digital conversion of the optical signal input.

15. The photonic analog to digital converter of claim 14, further comprising in the monolithically integrated optoelectronic integrated circuit an optical signal splitter for dividing a single optical signal input into N optical signals routed into the N channels of the converter.

16. An N-bit photonic analog to digital converter constructed in a monolithically integrated optoelectronic integrated circuit, comprising:
a plurality of optical signal channels where the number of channels is equal to N, each of said channels comprising at least one photodetector element that produces an output proportional to the amplitude of optical signal that impinges on the photodetector, said output from respective optical channels driving one of an array of means for binary switching, where one switching means is provided for each of the N optical channels, said switching means each having a binary output state, said binary switching means outputs collectively representing the N-bit output of the analog to digital conversion of the optical signal input.

17. The photonic analog to digital converter of claim 16, further comprising in the monolithically integrated optoelectronic integrated circuit an optical signal splitter for dividing a single optical signal input into N optical signals routed into the N channels of the converter.

18. An N-bit photonic analog to digital converter device comprising:
a substrate comprising N optical waveguides, each of said waveguides further comprising at least one photodetector for converting input light amplitude into an electronic output, said waveguide and photodetector combinations comprising N optoelectronic channels arranged from a most significant bit channel $N_{N-1}$ to a least significant bit channel $N_0$;
N differential pair comparators, one comparator connected to each optoelectronic channel output, each of said comparators having binary output states, each of said comparators having an input threshold calibrated to produce a digital high output at a predetermined signal input level, wherein each of said comparators provides a single bit of an N-bit digital representation of the input optical signal amplitude.

19. The photonic analog to digital converter of claim 18, further comprising:

means for feeding the output of each higher order significant bit comparator to the inputs of the comparators for each of the lower order significant bits in the comparator array thereby adjusting the input thresholds of the lower order significant bits when a higher order significant bit switches to a digital high state.

20. The photonic analog to digital converter of claim 19, wherein the photodetectors in each optical channel are velocity-matched distributed photodetectors.

21. The photonic analog to digital converter of claim 18, wherein the comparators comprise high speed heterojunction bipolar transistors.

22. The photonic analog to digital converter of claim 18, wherein the optical channels in the converter comprise photodetector arrays.

23. The photonic analog to digital converter of claim 18, wherein all of the components of the analog to digital converter are integrated on a monolithic optoelectronic integrated circuit.

24. An N-bit photonic analog to digital converter device comprising:

a substrate comprising N optical waveguides, each of said waveguides further comprising at least one photodetector for converting input light amplitude into an electronic output, said waveguide and photodetector combinations comprising N optoelectronic channels arranged from a most significant bit channel $N_{N-1}$ to a least significant bit channel $N_0$;

N means for binary switching, one switching means connected to each optoelectronic channel output, each of said switching means having binary output states, each of said switching means having an input threshold calibrated to produce a digital high output at a predetermined signal input level, wherein each of said switching means provides a single bit of an N-bit digital representation of the input optical signal amplitude.

25. The photonic analog to digital converter of claim 24, wherein the photodetectors in each optical channel are velocity-matched distributed photodetectors.

26. The photonic analog to digital converter of claim 24, wherein the switching means comprise high speed heterojunction bipolar transistors.

27. The photonic analog to digital converter of claim 24, wherein the optical channels in the converter comprise photodetector arrays.

* * * * *